(12) United States Patent
Lu

(10) Patent No.: US 8,084,823 B2
(45) Date of Patent: Dec. 27, 2011

(54) GATE MINIMIZATION THRESHOLD VOLTAGE OF FET FOR SYNCHRONOUS RECTIFICATION

(76) Inventor: Chao-Cheng Lu, Taipei (TW)

( * ) Notice: Subject to any disclaimer, the term of this patent is extended or adjusted under 35 U.S.C. 154(b) by 0 days.

(21) Appl. No.: 12/589,456

(22) Filed: Oct. 26, 2009

(65) Prior Publication Data
US 2011/0095371 A1    Apr. 28, 2011

(51) Int. Cl.
*H01L 27/06*    (2006.01)
(52) U.S. Cl. . 257/368; 257/288; 257/213; 257/E27.016; 323/266

(58) Field of Classification Search .................. 257/213, 257/288, 368, E27.016; 323/266
See application file for complete search history.

(56) References Cited

U.S. PATENT DOCUMENTS

| 6,343,023 | B1 * | 1/2002 | Wunderlich | 363/16 |
| 2007/0200346 | A1 * | 8/2007 | Kanazawa et al. | 290/40 B |
| 2009/0261790 | A1 * | 10/2009 | Arduini | 323/266 |

* cited by examiner

*Primary Examiner* — Long Pham

(57) ABSTRACT

A FET device for synchronous rectification of the present invention, a FET having no body diode, the characteristics have gate minimization threshold voltage equal or over load voltage, can be achieve FET turn on, and gate minimization threshold voltage under load voltage, can be achieve FET turn off.

12 Claims, 3 Drawing Sheets

GATE MINIMIZATION THRESHOLD VOLTAGE OF FET FOR SYNCHRONOUS RECTIFICATION

BACKGROUND OF THE INVENTION

1. Field of the Invention

The present invention related to enhancement mode FET having no body diode for synchronous rectification, used the characteristics of FET have gate minimization threshold voltage equal or over load voltage, FET is turn on, and used the characteristics of FET have gate minimization threshold voltage under load voltage, FET is turn off. According to such philosophy of the present invention, the synchronous rectification may be achieved with one N-Channel FET, or one P-Channel FET.

2. Description of Related Art

As shown in FIG. 5, a structure of the prior art single-ended forward converter circuit, has a pulse generator PG, a switching element SW, a high frequency transformer T1, a primary winding VP and secondary winding VS of the high frequency transformer T1, first terminal A and second terminal B of the secondary winding VS, a pair of first and second switching element F1, F2, a inductor L1, a capacitor C1, a load LD, and DC voltage output terminal C, D.

As shown in FIG. 5, when the positive of secondary winding VS in the terminal A, terminal B is negative, the switching element F1 is turned on, the switching element F2 is turned off, the path of the current flow is from terminal A of the secondary winding VS, though static shielding diode D2 of the switching element F2, switching element F1, and back to terminal B of the secondary winding VS, the possibility that F1, F2, may be burnout by current of the prior art N-Channel FET.

SUMMARY OF THE INVENTION

In order to provide FET that may elevate the efficiency of synchronous rectification, the present invention is proposed the following object:

The first object of the present invention to provide for a synchronous rectification, used the characteristics of FET have gate minimization threshold voltage equal or over load voltage, the FET in which the converter simplicity is improved.

The second object of the present invention provide a FET for synchronous rectification, can be eliminate the destruction of prior art FET, and windings due to a large current.

According to the defects of the prior art technology discussed above, a novel solution, the FET is proposed in the present invention, which provides higher efficiency in synchronous rectification.

DETAILED DESCRIPTION OF THE PREFERRED EMBODIMENTS

Figure 1:
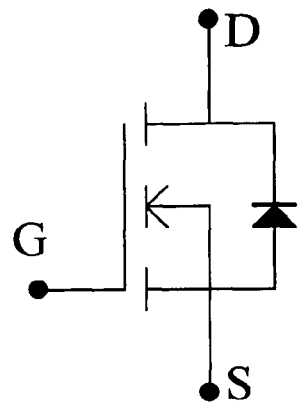
FIG. 1 is a circuit diagram of a prior art N-Channel FET.

FIG. 1 is a circuit diagram of a prior art N-Channel FET, a N-junction of the body diode connected to drain of the prior art N-Channel FET, a P-junction of the body diode connected to source of the prior art N-Channel FET.

Figure 2:
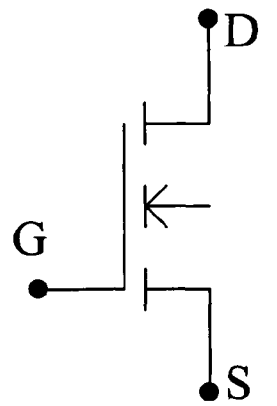
FIG. 2 is a circuit diagram of a N-Channel FET having no body diode.

FIG. 2 is a circuit diagram of a N-Channel FET having no body diode.

Figure 3:
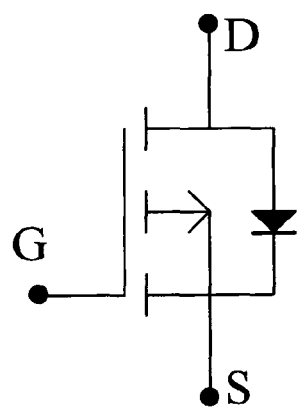
FIG. 3 is a circuit diagram of a prior art P-Channel FET.

FIG. 3 is a circuit diagram of a prior art P-Channel FET, a N-junction of the body diode connected to source of the prior art P-Channel FET, a P-junction of the body diode connected to drain of the prior art P-Channel FET.

Figure 4:
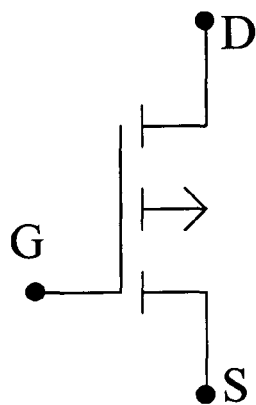
FIG. 4 is a circuit diagram of a P-Channel FET having no body diode.

FIG. 4 is a circuit diagram of a P-Channel FET having no body diode.

Figure 5:
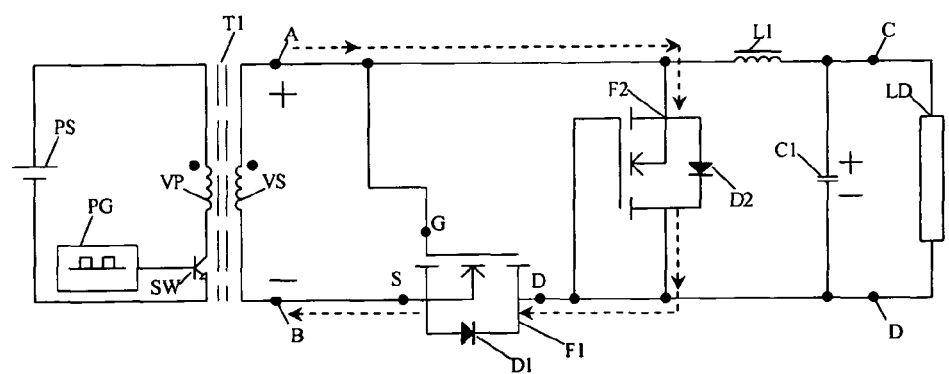
FIG. 5 is a circuit diagram of a prior art FET for single-ended forward converter.

FIG. 5 is a circuit diagram of a prior art FET for single-ended forward converter.

Figure 6:
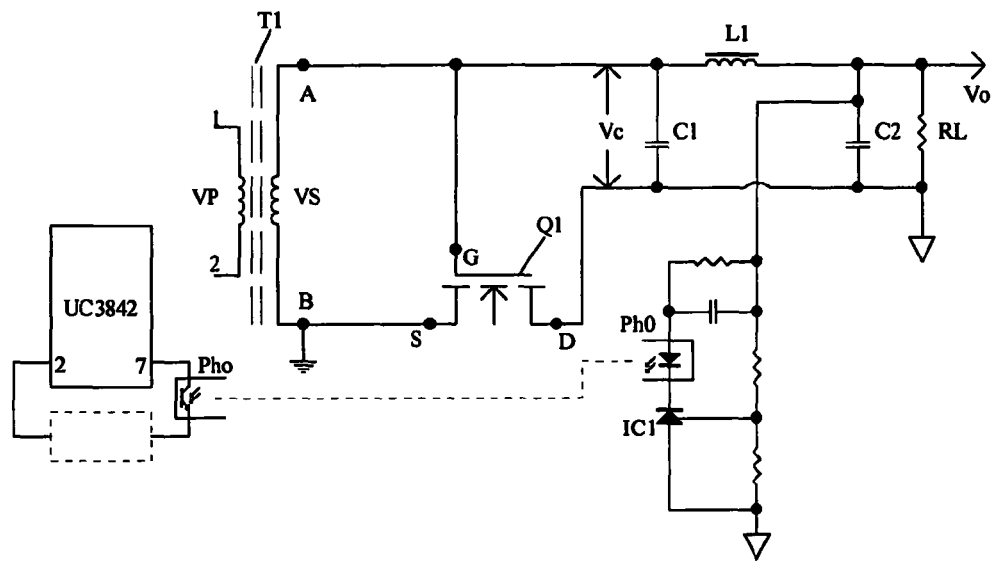
FIG. 6 is a circuit diagram of a first embodiment of the present invention.

FIG. 6 is a circuit diagram of a first embodiment of the present invention. In FIG. 6, while the voltage at terminal A of the first secondary winding of the high frequency transformer T1 is positive, terminal B is negative, the source terminal of N-Channel FET Q1 is negative voltage, the gate terminal of N-Channel FET Q1 is positive voltage, when prepare set gate minimization threshold voltage equal or over first capacity C1 voltage VC, the VC is load voltage, the N-Channel FET Q1 is turn on, the path of the current flow is from terminal A of the first secondary winding of high frequency transformer T1 though the first capacity C1, inductor L1, second capacity C2, load RL, drain terminal and source terminal of N-Channel FET Q1, and back to terminal B of the second secondary winding; when first capacity C1 voltage VC under prepare set gate minimization threshold voltage, the N-Channel FET Q1 is turn off; While the voltage at terminal A of the first secondary winding of the high frequency transformer T1 is negative, terminal B is positive, the source terminal of N-Channel FET Q1 is positive voltage, the gate terminal of N-Channel FET Q1 is negative voltage, the N-Channel FET Q1 is turn off.

Figure 7:
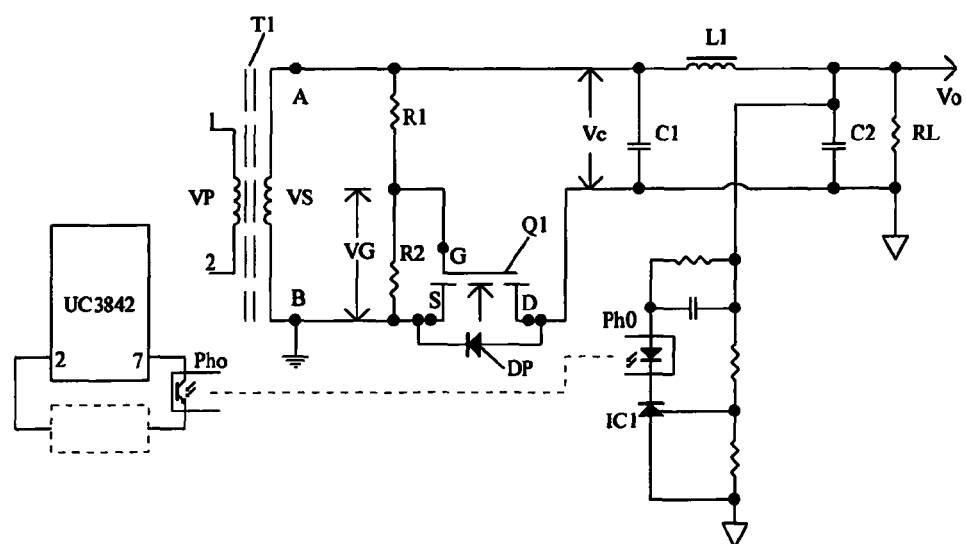
FIG. 7 is a circuit diagram of a second embodiment of the present invention.

FIG. 7 is a circuit diagram of a second embodiment of the present invention. Actually it is the circuit identical to that shown in FIG. 6 except for the gate terminal of N-Channel FET Q1 direct connected to terminal A of first secondary winding is replaced by a divider circuit, the divider circuit comprises first driven element R1 and second driven element R2, the first terminal of first driven element R1 connected to terminal A of the first secondary winding and positive terminal of first capacity C1, the second terminal of first driven element R1 connected to first terminal of the second driven element R2, and together connected to gate terminal of N-Channel FET Q1, the second terminal of the second driven element R2, is connected to terminal B of second secondary winding and source terminal of N-Channel FET Q1, the driving voltage of gate terminal VG of the N-Channel FET Q1 is equal to the second driven element R2 voltage drop, there are $VG = VC \times R2/(R1+R2)$, where VG is gate driven voltage of N-Channel FET Q1 equal to gate minimization threshold voltage of N-Channel FET Q1; VC is two terminal voltage of first capacity C1, the VC is load voltage; R1 is first driven element; R2 is second driving element; when the gate minimization threshold voltage of N-Channel FET Q1 equal or over VC, the N-Channel FET Q1 is turn on; when the gate minimization threshold voltage of N-Channel FET Q1 under VC, the N-Channel FET Q1 is turn off; An inrush diode DP parallel to the N-Channel FET Q1, a N-junction of the inrush diode DP connected to source of the N-Channel FET Q1, a P-junction of the inrush diode DP connected to drain terminal of the N-Channel FET Q1, especially inrush diode DP can be achieve protect the N-Channel FET Q1.

Figure 8:
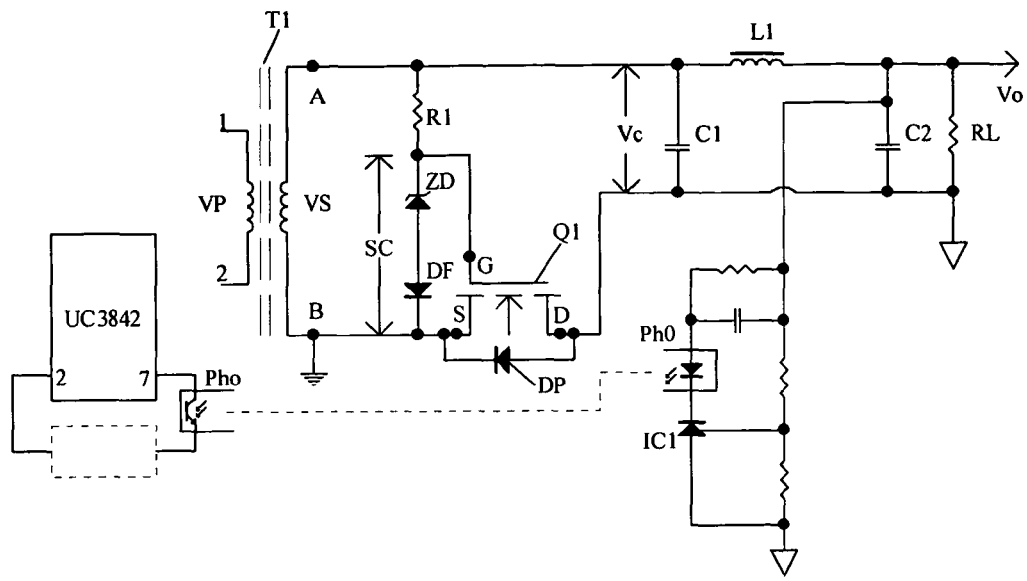
FIG. 8 is a circuit diagram of a third embodiment of the present invention.

FIG. 8 is a circuit diagram of a third embodiment of the present invention. Actually it is the circuit identical to that shown in FIG. 7 except for the second driven element R2 is replaced by a series circuit SC, the series circuit SC comprises of the zener diode ZD and diode DF, first driven R1 and second driven element SC, the first terminal of first driven element R1 connected to terminal A of the first secondary winding and positive terminal of first capacity C1, the second terminal of first driven element R1 connected to first terminal of the second driven element SC, and together connected to gate terminal of N-Channel FET Q1, the second terminal of the second driven element SC, is connected to terminal B of second secondary winding and source terminal of N-Channel FET Q1, the driving voltage of gate terminal VG of the N-Channel FET Q1 is equal to the second driven element SC two terminal voltage, the driven voltage of gate terminal VG is equal to zener voltage of zener diode ZD and forward voltage of diode DF, while VG is equal to gate minimization threshold voltage of N-Channel FET Q1; when the gate minimization threshold voltage of N-Channel FET Q1 equal or over VC, where VC is two terminal voltage of first capacity C1, the VC is load voltage, the N-Channel FET Q1 is turn on; when the gate minimization threshold voltage of N-Channel FET Q1 under VC, the N-Channel FET Q1 is turn off; An inrush diode DP parallel to the N-Channel FET Q1, a N-junction of the inrush diode DP connected to source terminal of the N-Channel FET Q1, a P-junction of the inrush diode DP connected to drain terminal of the N-Channel FET Q1, especially inrush diode DP can be achieve protect the N-Channel FET Q1.

Figure 9:
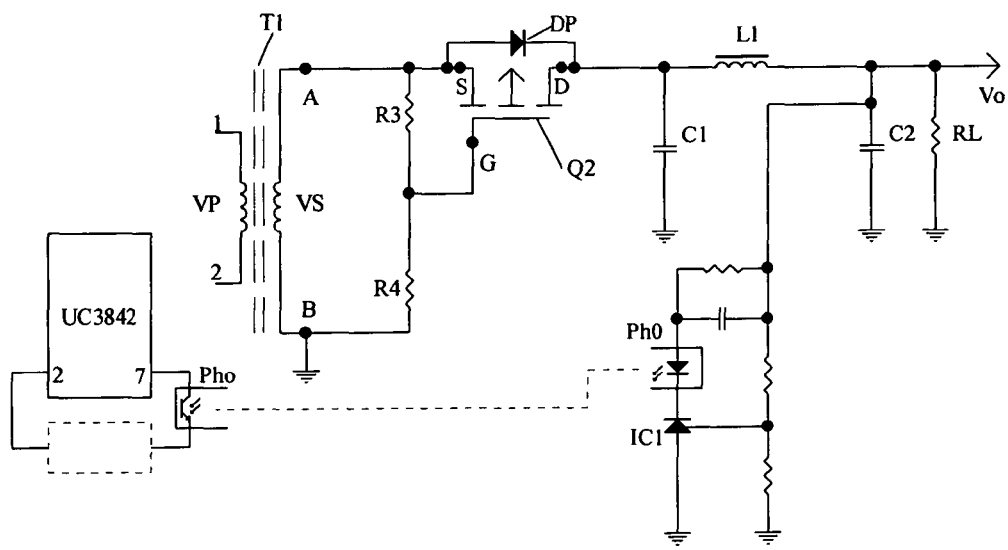
FIG. 9 is a circuit diagram of a fourth embodiment of the present invention.

FIG. 9 is a circuit diagram of a fourth embodiment of the present invention. Actually it is the circuit identical to that shown in FIG. 7 except for the N-Channel FET Q1 is replaced by a P-Channel FET Q2, the divider circuit Comprises first driven element R3 and second driven element R4, the first terminal of first driven element R3 connected to terminal A of the first secondary winding and the source of P-Channel FET Q2, the second terminal of first driven element R3 connected to first terminal of the second driven element R4, and together connected to gate terminal of P-Channel FET Q2, the second terminal of the second driven element R4, is connected to terminal B of second secondary winding and common ground, the driving voltage of gate terminal VG of the P-Channel FET Q2 is equal to the first driven element R3 voltage drop, there are VG=VC.times.R3/(R3+R4), where VG is gate driven voltage of P-Channel FET Q2 equal to gate minimization threshold voltage of P-Channel FET Q2; VC is two terminal voltage of first capacity C1, the VC is load voltage; R3 is first driven element; R4 is second driving element; when the gate minimization threshold voltage of P-Channel FET Q2 equal or over VC, the P-Channel FET Q2 is turn on; when the gate minimization threshold voltage of P-Channel FET Q2 under VC, the P-Channel FET Q2 is turn off; An inrush diode DP parallel to the P-Channel FET Q2, a P-junction of the inrush diode DP connected to source terminal of the P-Channel FET Q2, a N-junction of the inrush diode DP connected to drain terminal of the P-Channel FET Q2, especially inrush diode DP can be achieve protect the P-Channel FET Q2.

What is claimed is:

1. A FET (Field Effect Transistor) device for synchronous rectification comprises:

a FET having no body diode, wherein the FET having a source terminal, a gate terminal, and a drain terminal;

a power source having two terminals, the power source connecting to the FET, one terminal of the power source connecting to the gate terminal of FET, and another terminal of the power source connecting to a source terminal of FET;

a gate minimization threshold voltage circuit connecting to the FET and the power source, the power source forming a gate threshold minimization voltage via the gate minimization voltage circuit, and the gate minimization voltage dropped into said gate terminal.

2. The FET device for synchronous rectification as in claim 1, wherein said gate minimization threshold voltage circuit further comprising a first driven element and a second driven element, and said gate minimization voltage is generated by said second driven element.

3. The FET device for synchronous rectification as in claim 2, wherein said gate minimization threshold voltage is equal or over load voltage generated by a load element in order to turn on said source terminal and said drain terminal of said FET, wherein the load element is connected to the FET.

4. The FET device for synchronous rectification as in claim 3, wherein said gate minimization threshold voltage is under load voltage in order to turn off said source terminal and said drain terminal of said FET.

5. The FET device for synchronous rectification as in claim 1, wherein said gate minimization threshold voltage circuit is directly connected to power source.

6. The FET device for synchronous rectification as in claim 1, wherein said gate minimization threshold voltage is a dropped voltage generated by said second driven element, a zener voltage generated by a zener diode, or a forward voltage in a diode respectively when the FET is a N-channel type.

7. The FET device for synchronous rectification as in claim 6, wherein said gate minimization threshold voltage is sum of said zener voltage and said forward voltage, wherein said second driver element is consisted of said zener diode and said diode.

8. The FET device for synchronous rectification as in claim 1, wherein said gate minimization threshold voltage is a dropped voltage generated by said first driven element voltage, a zener voltage generated by a zener diode, or a forward voltage in a diode respectively when the FET is a P-channel type.

9. The FET device for synchronous rectification as in claim 1, wherein an inrush diode having a N-junction and a P-junction is connected to said FET in parallel when said FET is a N-Channel type, wherein said N-junction is connected to said source terminal of said FET, and said P-junction is connected to said drain terminal of said FET.

10. The FET device for synchronous rectification as in claim 1, wherein an inrush diode having a N-junction and a P-junction is connected to said FET in parallel when said FET is a P-Channel type, wherein said P-junction is connected to said source terminal of said FET, and said N-junction is connected to a drain terminal of said FET.

11. The FET device for synchronous rectification as in claim 9, wherein said inrush diode is a fast diode, a schottky diode or a zener diode.

12. The FET device for synchronous rectification as in claim 10, wherein said inrush diode is a fast diode, a schottky diode or a zener diode.

* * * * *